United States Patent
Naffziger et al.

(10) Patent No.: US 6,489,834 B2
(45) Date of Patent: Dec. 3, 2002

(54) SYSTEM AND METHOD UTILIZING ON-CHIP VOLTAGE MONITORING TO MANAGE POWER CONSUMPTION

(75) Inventors: Samuel D. Naffziger, Ft. Collins, CO (US); Don D Josephson, Ft Collins, CO (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/811,243

(22) Filed: Mar. 16, 2001

(65) Prior Publication Data

US 2002/0130712 A1 Sep. 19, 2002

(51) Int. Cl.[7] .................................................. H03K 3/01
(52) U.S. Cl. ..................................................... 327/534
(58) Field of Search .............................. 327/58, 60, 62, 327/77, 80, 81, 88, 89, 90, 336, 344, 345, 365, 419, 427, 478, 534, 535, 538

(56) References Cited

U.S. PATENT DOCUMENTS

| | | | | |
|---|---|---|---|---|
| 5,432,471 A | * | 7/1995 | Majumdar et al. | 327/310 |
| 5,635,868 A | * | 6/1997 | Aiello et al. | 327/108 |
| 5,650,737 A | * | 7/1997 | Eilley | 327/108 |
| 6,127,816 A | * | 10/2000 | Hirst | 323/283 |
| 6,144,187 A | * | 11/2000 | Bryson | 320/137 |

* cited by examiner

Primary Examiner—Jeffrey Zweizig (57) ABSTRACT

A system and method are disclosed that utilize analog detection of an integrated circuit's ("chip's") power consumption to enable power consumption management. On-chip circuitry may be utilized to detect analog electrical characteristics of the chip, such as its voltage, from which the chip's power consumption is determined. One embodiment utilizes on-chip circuitry to manage long-term, sustained power consumption of the chip, which encompasses power consumption for approximately a microsecond, as well as more extended time frames. Another embodiment utilizes on-chip circuitry to manage short-term power consumption of the chip, which encompasses power consumption for less than a microsecond (e.g., nanosecond time frame). A preferred embodiment implements both the circuitry for managing long-term power consumption and the circuitry for managing short-term power consumption. On-chip control circuitry may be implemented to trigger certain operations to reduce the chip's long-term and/or short-term power consumption upon determination that such power consumption is too high.

30 Claims, 2 Drawing Sheets

SYSTEM AND METHOD UTILIZING ON-CHIP VOLTAGE MONITORING TO MANAGE POWER CONSUMPTION

This application is related to co-pending and commonly assigned U.S. patent application Ser. No. 09/811,255, entitled "SYSTEM AND METHOD UTILIZING ON-CHIP VOLTAGE CONTROLLED FREQUENCY MODULATION TO MANAGE POWER CONSUMPTION" filed Mar. 16, 2001, the disclosure of which is hereby incorporated herein by reference.

TECHNICAL FIELD

This invention relates in general to management of power consumption by an integrated circuit, and in specific to a system and method that utilize on-chip voltage comparators to monitor the long-term (sustained) and short-term (instantaneous) power consumption of the chip to generate signals utilized for dynamically controlling operation of the chip in order to effectively manage its long-term and short-term power consumption.

BACKGROUND

Integrated circuits (commonly referred to as "chips"), such as microprocessors, are utilized in an ever-increasing number of various applications. For instance, such chips are commonly implemented not only in personal computers (PCs) and laptops, but are typically implemented in much smaller (and more portable) devices, such as personal digital assistants (PDAs), cellular telephones, pagers, and various other types of devices. Considering the number of tasks that such chips are relied upon to perform, the desire for fast processing speeds (to allow tasks to be performed quickly), and the desire for limited power consumption by such chips, chip designers are faced with the difficult task of designing chips that achieve the desired performance (e.g., fast processing speed), while managing the power consumption of the chips. Given the ever-increasing advances being made in performance of chips, such as microprocessors, power consumption is becoming a serious concern. For example, power consumption is becoming a serious performance limiter for high speed microprocessors. For instance, it seems that with each succeeding generation of microprocessors, on-chip voltage-supply budgets dwindle while ac current consumption increases. Thus, a key design objective for microprocessor systems is providing the highest possible peak performance for compute-intensive code, while reducing power consumption of the microprocessor system. Particularly when such microprocessor systems are to be implemented within portable electronic devices, reduction in power consumption (at least during low performance periods) is desirable to maximize the battery life of the device.

As is well known, power consumption of a chip may be generally computed utilizing the following equation: $P = C*V^2*F$, wherein P represents power consumption, C represents switching capacitance, V represents operating voltage, and F represents the clock frequency of the chip. In view of such equation, it should be understood that switching capacitance (C), voltage (V), and frequency (F) are all factors in determining the power consumption (P) of a chip. In many cases, it is necessary to limit processor frequency (F) and/or voltage (V) in order to hold the power consumption (P) of a chip below a certain level that is acceptable for use in a given system (e.g., within a desktop or portable devices).

Generally, two related power consumption concerns are present in chip designs. A first concern is the long-term (or sustainable) power consumption of the chip. In this regard, "long-term" (or sustainable) power consumption encompasses micro to millisecond time frame, which may be relatively long-term in operation of some chip designs. It is generally desirable to provide a chip design that provides a relatively low sustained power consumption. As described further below, prior art chip designers typically determine the maximum power that the chip may consume during worst case operation (e.g., during very compute-intensive operation), and may establish such determined maximum power as the sustained power to be supplied to the chip in order to allow for proper operation during worst case operations.

A second concern that arises with chip design is short-term (or instantaneous) power consumption. In this regard, "short-term" (or instantaneous) power consumption encompasses nanosecond time frame. For example, a chip may, on average, require 20 watts of power, but may suddenly pull 100 watts of power. As those of ordinary skill in the art will appreciate, such a sudden step in power (e.g., a sudden step in the current load) will generally result in a droop in voltage. For instance, suppose that for all circuits on a chip to operate at a desired frequency (e.g., 1 gigahertz) the chip must receive a supply voltage above a particular minimum value, say 1 volt. Thus, in this example, if the voltage droops to 0.9 volt, then the circuits fail to operate at 1 gigahertz and the part will fail. Thus, it is necessary to ensure that the voltage does not droop below 1 volt in this example. If big step loads are encountered on the chip, then a guard band of additional voltage (above the required 1 volt) may need to be supplied to the chip. For instance, if step loads are encountered by the chip that result in a voltage droop up to 100 millivolts (i.e., 0.1 volt) at any instant, then 1.1 volts actually needs to be fed to the chip so that when a voltage droop of 0.1 volt is encountered the chip will still be supplied the necessary 1 volt to maintain proper operation at the 1 gigahertz frequency. That is, when a step load event is encountered, the voltage may droop briefly to 1 volt, and will then return to 1.1 volts. Thus, the additional 0.1 volt is required solely to guard band against step load events.

It is generally desirable to reduce the amount of sustained power required by a chip. Furthermore, it is generally desirable to reduce the amount of voltage droop that a chip encounters during operation (e.g., upon incurring step load conditions). Typically, such desires in designing chips are somewhat in conflict. For example, as a chip designer lowers the sustained power consumption of a chip, the chip generally encounters greater voltage droops (as a result of step loads). For instance, suppose a chip is designed having a sustainable power consumption of 60 watts, and from time to time briefly encounters step load conditions requiring 80 watts, thereby resulting in a voltage droop. Further suppose that the chip designer implements a design that reduces the chip's sustainable power consumption to only 20 watts. If the chip continues to encounter such step load conditions requiring 80 watts, much greater voltage droops will be recognized. Thus, while the designer has reduced the long-term, sustainable power consumption of the chip, the voltage droop encountered by the chip is much greater. Accordingly, it is often difficult to effectively manage both the long-term, sustained power consumption, as well as the short-term power consumption of a chip.

Various prior art solutions have been implemented for managing long-term (sustainable) power consumption on a chip. Microprocessor chips of the prior art have typically been implemented with a fixed voltage and frequency determined to prevent the chip from consuming more than a particular amount of power. Typically, in designing prior art microprocessor chips, a designer tests the chip with software code for creating a heavy computational load on the chip in order to determine the appropriate voltage and frequency that may be implemented for the chip such that its power consumption does not exceed a particular amount when heavy computational loads are encountered by the chip. However, once implemented, such heavy computational loads may be encountered relatively seldom, with low (or no) computational load being placed on the microprocessor much of the time. Accordingly, the worst case computational loads dictate the voltage and frequency of the chip, thereby hindering performance of the chip (e.g., because of the decreased frequency required for the worst case) and resulting in inefficient use of power (as much of the power is wasted during most of the chip's operation).

Prior art solutions have also been proposed for reducing the amount of voltage droops encountered on a chip (i.e., for managing a chip's short-term power consumption). One power-saving technique implemented in prior art microprocessor chips involves regulating the voltage of the on-chip power supply to reduce voltage droops, thereby allowing for higher clock frequency to be implemented on the chip. More specifically, this technique attempts to improve the integrity of the on-chip power supply by regulating it carefully so that the average voltage to the chip can be reduced (i.e., because sudden changes in power consumption tend to cause the voltage to droop below average). For instance, a filtered version of the chip's voltage may be monitored to detect whether it is above or below the chip's average voltage at any given time. Power supplies commonly perform this kind of voltage regulation in attempt to maintain their output voltage constant. By reducing the droops through voltage regulation, the average voltage on the chip can be reduced by the magnitude of such droop reduction with no frequency reduction, and such reduction in average voltage results in reduced power consumption by the chip. Such an implementation that improves the integrity of the on-chip power supply to reduce voltage droops of a microprocessor is described in greater detail in *An On-chip Voltage Regulator using Switched Decoupling Capacitors*, by Michael Ang, Raoul Salem, and Alexander Taylor, published in ISSCC 2000 (White Paper 26.7), the disclosure of which is hereby incorporated herein by reference.

Such prior art technique generally aids in improving power integrity. However, such technique for improving power integrity attempts to supply extra current to a chip during high activity periods, thereby failing to actually reduce power consumption. Further, the additional current supplied during such periods is necessarily limited in supply by the quantity of capacitance. That is, this technique performs the function of reducing the overall variability of the power supply at the chip, thereby increasing the minimum voltage seen by the chip for a given average. This improves the power consumption at a particular operating frequency by reducing the average voltage (recall: $P=CV^2F$). The amount of change in current that can be compensated by this technique is limited by the amount of charge that can be stored in the regulator's capacitors, which in turn limits the benefit in terms of reduction in voltage droop.

SUMMARY OF THE INVENTION

In view of the prior art, a desire exists for a method and system for better managing power consumption of a chip. More particularly, a desire exists for a method and system for effectively managing long-term, sustained power consumption of a chip, while also managing short-term power consumption (e.g., to reduce voltage droops encountered).

The present invention is directed to a system and method which utilize analog detection of power consumption of an integrated circuit to enable management of such power consumption. Typical prior art power management techniques utilize digital detection of power consumption through such methods as utilizing circuitry and/or software to detect particular instruction sequences to be executed by the integrated circuit that are known to result in a large amount of power consumption. However, such digital detection methods often do not allow for accurate/precise detection of power consumption, and such digital detection methods are often not versatile in that instructions may be encountered for which the amount of power consumption that results from such instructions is unknown. Additionally, unanticipated conditions that result in large power consumption may be encountered during operation of the integrated circuit which such digital detection methods may be unable to detect. Various embodiments of the present invention utilize analog detection of power consumption. For instance, various embodiments of the present invention utilize on-chip circuitry to detect analog electrical characteristics of the chip, such as the voltage level on the chip, from which the chip's power consumption may be determined. Such analog detection of power consumption enables a very accurate/precise management of a chip's power consumption.

One embodiment of the present invention utilizes on-chip circuitry to manage long-term, sustained power consumption of the chip. Such long-term, sustained power consumption is intended to encompass power consumption for approximately a microsecond, as well as more extended time frames. On-chip circuitry may be implemented to determined whether the chip's power consumption is above a determined amount. For example, a predetermined average may be defined during development/testing of the chip, and circuitry may be implemented on the chip to detect when the chip's power consumption is above such predetermined average. More specifically, a low-pass filter may be implemented on the chip to provide a low-pass filtered voltage for the chip. For instance, a resistor and capacitor may be arranged to form a low-pass filter, or any other suitable low-pass filter may be implemented on the chip to provide such low-pass filtered voltage. Additionally, a voltage comparator (e.g., an analog to digital converter) may be implemented on the chip. The voltage comparator receives as one input the low-pass filtered voltage of the chip. For its other input, the voltage comparator receives "clean feed" voltage that comprises voltage supplied to the chip by an off-chip power supply offset by a predetermined amount (such predetermined amount may, for example, correspond to the nominal DC voltage drop across the chip's package parasitic resistance when its power consumption is equal to the predetermined average). If the voltage comparator determines that the low-pass filtered voltage is greater than the clean feed voltage, then the chip's power consumption is known to be less than the predetermined average, and vice-versa.

The voltage comparator outputs a signal indicating whether the low-pass filtered voltage is greater than the clean feed voltage, and such signal may be input to on-chip control circuitry, which may manage the chip's power consumption responsive to such signal. For instance, if determined that the chip's long-term power consumption is too high (based on the output signal of the voltage comparator), the control circuitry may trigger certain operations to reduce the chip's long-term power consumption. As one example of a power-reducing operation that may be triggered, certain functional units that are relatively big power consumers on the chip may be throttled.

Another embodiment of the present invention utilizes on-chip circuitry to manage short-term power consumption of the chip. Such short-term power consumption is intended to encompass power consumption for less than a microsecond (e.g., nanosecond time frame). On-chip circuitry may be implemented to determined whether the chip's short-term power consumption is above a determined amount (which may be predetermined for the chip). More specifically, as described with the above embodiment, a low-pass filter may be implemented on the chip to provide a low-pass filtered voltage for the chip. Additionally, a voltage comparator (e.g., an analog to digital converter) may be implemented on the chip. The voltage comparator receives as one input the low-pass filtered voltage of the chip. For its other input, the voltage comparator receives the instantaneous on-chip voltage (i.e., the voltage present on the chip's power grid). If the voltage comparator determines that the chip's instantaneous voltage is greater than the low-pass filtered voltage, then the chip has entered a higher power consumption mode.

The voltage comparator outputs a signal indicating whether the chip's instantaneous voltage is greater than the low-pass filtered voltage, and such signal may be input to on-chip control circuitry, which may manage the chip's short-term power consumption responsive to such signal. For instance, if determined that the chip's short-term power consumption is too high (based on the output signal of the voltage comparator), the control circuitry may trigger certain operations to quickly reduce the chip's short-term power consumption. As one example of a power-reducing operation that may be triggered, certain functional units that are relatively big power consumers on the chip may be throttled.

A preferred embodiment of the present invention implements both the circuitry for managing long-term power consumption and the circuitry for managing short-term power consumption. In this manner, analog detection of electrical characteristics (e.g., voltage) of an integrated circuit may be utilized to detect and manage both long-term and short-term power consumption of the chip.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWING

For a more complete understanding of the present invention, reference is now made to the following descriptions taken in conjunction with the accompanying drawing, in which.

DETAILED DESCRIPTION

As described above, a desire often exists for minimizing long-term power consumption of a chip. Furthermore, such "long-term" power consumption is intended to encompass micro to millisecond time frames, as examples, as well as more extended time frames. As also described above, typical prior art chip designs are typically based on a worst case power consumption. For instance, it may be determined through testing a chip with compute-intensive code that the maximum power that may be required by the chip is 88 watts. However, in operation the average power required by the chip may only be 60 watts. Thus, 28 watts of power may typically be wasted, as the chip may require such worst case power relatively infrequently. Of course, such additional power is required to be built into the design of the power supplies and packaging that support prior art chips to avoid failure of the chips in those situations when the worst case power is required (e.g., in very compute-intensive situations). It should be understood that this is not an efficient use of power delivery resources, as much of the infrastructure designed to supply the worst case power situation is wasted. In addition, even if the worst case power is not consumed, a customer purchasing a system that utilizes this prior art technique is required to pay the extra cost for the power delivery infrastructure and must ensure that his computer room can support the worst case power consumption as specified by the computer designer.

Continuing with the above example, a chip manufacturer may desire to design a chip that utilizes a means of detecting when the chip is burning above-average power for a sustained period of time, and then use that information to alter the chip's operation (e.g., decrease its frequency) in order to bring the power consumption back down to its predetermined average. For instance, in this example the chip manufacturer may determine (through testing of the chip) that its average power consumption should be 60 watts, and may therefore implement a means for detecting when the chip is burning above such predetermined average (e.g., when it reaches 70 or 75 watts), which triggers appropriate actions to reduce the chip's power consumption back to its predetermined average of 60 watts. In this manner, the manufacturer could design a less expensive system that is generally only required to dissipate a supply of 60 watts of power, rather than being required to dissipate the above-described 88 watts of power to allow for proper operation during the worst case power situation.

Figure 1:
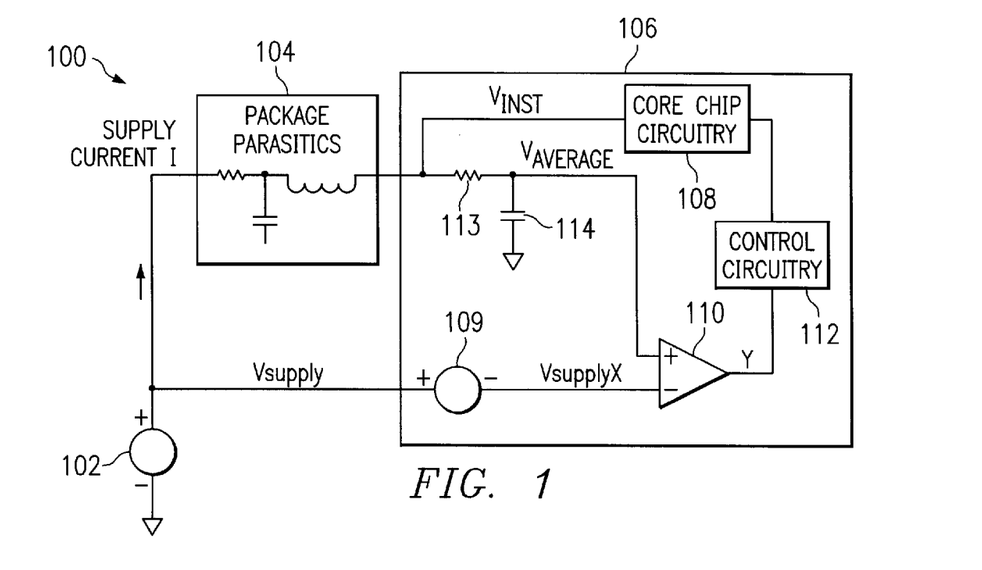
FIG. 1 shows a canonical implementation of a first embodiment of the present invention, which enables management of long-term, sustained power consumption of a chip.

One embodiment of the present invention provides a system and method for effectively managing relatively long-term (sustained) power consumption. For example, one embodiment of the present invention enables management of the chip's operation to effectively maintain the chip's long-term power consumption near a predetermined value for the chip, such as a predetermined average power consumption for the chip. Turning to FIG. 1, an exemplary implementation of this first embodiment of the present invention is shown. A portion of a system 100 is shown, which includes power supply 102 that supplies power to a chip 106. More specifically, a voltage signal and ground signal are supplied by power supply 102, which are typically fed through some package parasitics 104 to chip 106. Such package parasitics 104 are well known to those of ordinary skill in the computer arts, and therefore will not be described in great detail herein. Thus, for instance, the resulting voltage signal $V_{INST}$ (or "instantaneous voltage") is received by chip 106. It should be understood that chip 106 may be any type of integrated circuit, including without limitation a microprocessor. Chip 106 further includes core chip circuitry 108, which may include any functional component of chip 106 (e.g., clocked circuitry components), such as logic to execute instructions in a microprocessor, storage elements for information the chip may utilize for performing operations, arithmetic processing logic, etcetera. As shown in FIG. 1, $V_{INST}$ is the voltage supplied to core circuitry 108. That is, $V_{INST}$ is the instantaneous voltage present at any given time on the chip's power grid (the metal plane distributing power to the chip's circuitry).

Chip 106 further comprises voltage comparator 110 and control circuitry 112, which are described in greater detail hereafter. Voltage comparator 110 may receive two analog signals (e.g., voltage) as input, and output one or more digital signals that indicate which analog input is greater and optionally, may output signals to indicate the magnitude of the voltage difference. This type of circuit is commonly known in the art as an analog to digital converter or A/D converter. Of course, any comparator (e.g., A/D converter) now known or later developed that is suitable for comparing such voltage values may be implemented within this first embodiment. As shown, voltage comparator 110 receives as one input a "quiet version" of the power supply on chip 106 (shown in FIG. 1 as "$V_{AVERAGE}$"), which is a filtered version of the power. More specifically, $V_{AVERAGE}$ input to voltage comparator 110 is voltage $V_{INST}$ taken from somewhere on chip 106 and ran through a low-pass filter. For instance, in the example of FIG. 1, $V_{AVERAGE}$ input to voltage comparator 110 is voltage $V_{INST}$ taken from somewhere on chip 106 and ran through resistor 113 and capacitor 114, as shown in FIG. 1. Resistor 113 and capacitor 114 form a low-pass filter with a cutoff frequency defined by the R*C product. The effect of this filter is to provide a long-term average voltage that changes at a low frequency relative to $V_{INST}$. In order to tune the frequency response of this filter, larger values of R*C provide more averaging and smaller values allow $V_{AVERAGE}$ to change more quickly in response to $V_{INST}$ changes. Rather than such resistor/capacitor implementation, various other implementations of a low-pass filter may be utilized, and any such implementation is intended to be within the scope of the present invention. As one example, an A/D converter may be utilized to convert the analog voltage signal to a digital signal, and a digital low-pass filter may be utilized.

Voltage comparator 110 receives as its other input feed from the external (off-chip) power supply 102. More specifically, as shown in the example of FIG. 1, $V_{SUPPLY}$ supplied by power supply 102 may be fed to voltage offset 109, which outputs VsupplyX to voltage comparator 110. Voltage offset 109 may be calibrated to match the nominal DC voltage drop across the package parasitic resistance when the chip power consumption matches the specified average. Therefore, when voltage comparator (A/D converter) 110 indicates that $V_{AVERAGE}$ is greater than VsupplyX, the recent power consumption of the chip is known to be less than average and vice-versa. Voltage offsets on A/D converters can be implemented in many ways. As one example, such voltage offsets on A/D converters are commonly implemented by calibration of the digital outputs. For instance, if output "Y" of A/D converter 110 is multiple bits, the value is checked when the chip is set to consume the predetermined average amount of power. This value can then be subtracted off subsequent measurements to indicate whether $V_{AVERAGE}$ is above or below the calibrated value.

Thus, voltage comparator 110 receives as its second input signal "VsupplyX," which is the clean feed from external power supply 102 having bypassed package parasitics 104 and instead having been offset (via voltage offset 109) by the nominal DC voltage drop commonly encountered across package parasitics 104 when the chip power consumption matches the predetermined average for the chip. Accordingly, voltage comparator 110 is capable of determining the difference between the on-chip voltage ("$V_{AVERAGE}$") and the voltage as delivered by power supply 102 ("VsupplyX"). That is, comparator 110 measures the voltage drop across the package parasitics 104, which provides information on long-term (e.g., micro to millisecond time frame) power consumption as delivered by power supply 102, after the filtering of the package bypass capacitance and parasitics.

Voltage comparator 110 outputs a signal "Y," which is input to control circuitry 112 that is capable of altering some aspect of the operation of chip 106 (e.g., to slow its operational frequency) in response to signal Y in order to manage the power consumption of chip 106. Control circuitry 112 may be implemented, for example, as firmware (thus including software executing on such circuitry) or simply as circuit components. Such control circuitry 112 may, in response to signal Y indicating that $V_{AVERAGE}$ is greater than VsupplyX trigger certain operations to reduce the sustained power ($V_{AVERAGE}$) of chip 106. As one example of a power-reducing operation that may be triggered by control circuitry 112, certain functional units that are relatively big power consumers on chip 106 may be throttled. As another example of a power-reducing operation that may be triggered by control circuitry 112, bubbles (e.g., stalls) may be inserted into the operational pipeline of the chip to decrease its activity. Any number of other power-reducing actions may be available for control circuitry 112 to trigger in order to reduce the chip's power consumption toward the predetermined target, such as reducing the operating frequency and/or voltage of the chip itself by controlling an on-chip clock generator or providing a digital signal to the power supply.

As described above, in this first embodiment, voltage comparator 110 compares the RC filtered voltage ($V_{AVERAGE}$) with the voltage supplied by the off-chip power supply 102 (VsupplyX) to determine whether the chip is below or operating close to a predetermined power consumption (e.g., a predetermined average power consumption for the chip). If the sustained power consumption of the chip increases above that predetermined amount, then signal Y output by comparator 110 will trigger control circuitry 112 to initiate some action to reduce the chip's sustained power consumption.

It is also often desirable to reduce the amount of step loads encountered during a chip's operation. Such a reduction in the amount of step loads is a desire that is somewhat in conflict with the above-described desire of reducing the average power consumption of a chip (because typically a lower average in power consumption will result in a greater step load being encountered). When such step loads are encountered it is desirable to have a means for responding, in the short-term (or instantaneously) to such step load condition to manage power consumption of the chip, e.g., in order to avoid large voltage droops.

Figure 2:
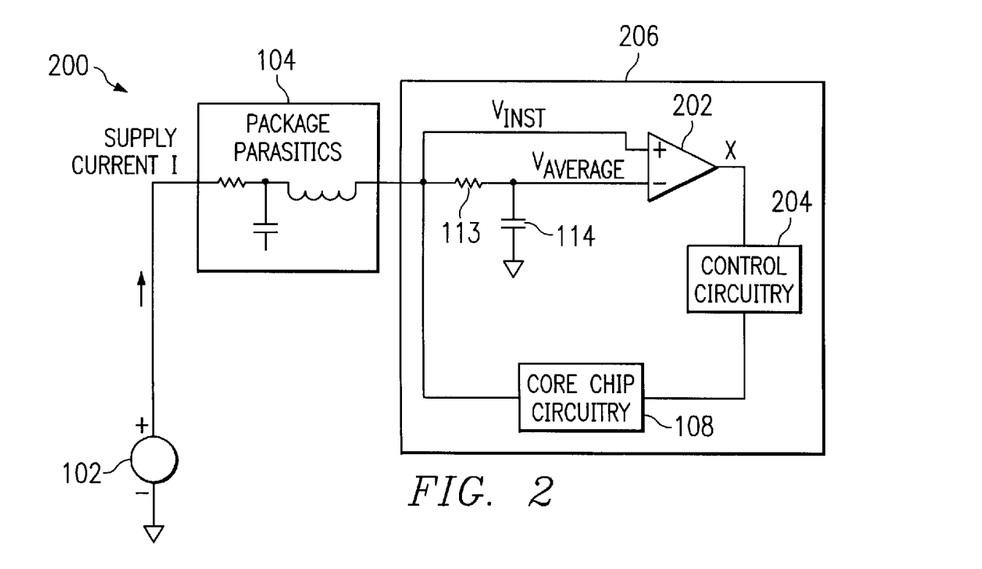
FIG. 2 shows a canonical implementation of a second embodiment of the present invention, which enables management of short-term power consumption of a chip in order to reduce voltage droops encountered thereby.

A second embodiment of the present invention provides a system and method for effectively managing relatively short-term power consumption. In this regard, "short-term" (or instantaneous) power consumption is intended to encompass nanosecond time frame, as an example. For example, a second embodiment of the present invention enables management of the chip's operation to effectively maintain the chip's short-term power consumption near a predetermined value for the chip, such as a predetermined average power consumption for the chip. Turning to FIG. 2, a canonical implementation of a second embodiment of the present invention is shown, wherein like reference numerals are utilized to refer to like components as that of FIG. 1. In FIG. 2 a portion of a system 200 is shown, which includes power supply 102 that supplies power to chip 206. As described above with FIG. 1, a voltage signal and ground signal are supplied by power supply 102, which are typically fed through some package parasitics 104 to chip 206. Thus, for instance, the resulting voltage signal $V_{INST}$ (or "instantaneous voltage") is received by chip 206. As with chip 106 of FIG. 1, it should be understood that chip 206 may be any type of integrated circuit, including without limitation a microprocessor. Chip 206 further includes core chip circuitry 108, which may include any functional component(s) of chip 206, and such components of core chip circuitry 108 receive voltage $V_{INST}$. Chip 206 further comprises voltage comparator (e.g., A/D converter) 202 and control circuitry 204, which are described in greater detail hereafter.

As with voltage comparator 110 of FIG. 1, voltage comparator 202 may receive two analog signals (e.g., voltage) as input, and output one or more digital signals that digitally represent the difference in voltage of the inputs. Of course, any comparator (e.g., A/D converter) now known or later developed that is suitable for comparing such voltage values may be implemented within this second embodiment. As shown, voltage comparator 202 receives as one input a "quiet version" of the power supply on chip 206 (shown in FIGS. 1 and 2 as "$V_{AVERAGE}$"), which is low-pass filtered version of the power. More specifically, $V_{AVERAGE}$ input to voltage comparator 202 is voltage $V_{INST}$ taken from somewhere on chip 206 and ran through resistor 113 and capacitor 114, which form a low pass filter as described with FIG. 1. While the RC filtered example is shown in the example of FIG. 2, it should be understood that any other suitable implementation of a low-pass filter now known or later discovered is intended to be within the scope of the present invention. Voltage comparator 202 receives $V_{INST}$ as its other input, which is the instantaneous on-chip voltage (which is supplied to core chip circuitry 108). More specifically, such instantaneous voltage $V_{INST}$ is the voltage on the chip's power grid at any given time. Accordingly, voltage comparator 202 is capable of determining the difference between the low-pass filtered version of the on-chip voltage ("$V_{AVERAGE}$") and the instantaneous on-chip voltage ("$V_{INST}$"). If $V_{INST}$ is greater than $V_{AVERAGE}$, this indicates that the instantaneous power consumption is less than average (e.g., the chip has just gone from a higher power operating mode to lower power). Conversely if $V_{INST}$ is lower than $V_{AVERAGE}$, the chip has just entered a higher power consumption mode, which may trigger various responses to control this change in power.

Voltage comparator 202 outputs a signal "X," which is input to control circuitry 204 that is capable of rapidly responding to alter some aspect of the operation of chip 206 (e.g., to slow its operational frequency) in response to signal X in order to manage the power consumption of chip 206. As one example of a power-reducing operation that may be triggered by control circuitry 204, certain functional units that are relatively big power consumers on chip 206 may be throttled. As another example of a power-reducing operation that may be triggered by control circuitry 204, bubbles (e.g., stalls) may be inserted into the operational pipeline of the chip to decrease its activity. Any number of other power-reducing actions may be available for control circuitry 204 to trigger in order to reduce the chip's power consumption toward the predetermined target. As a further example of a power-reducing action that may be triggered by control circuitry 204, the chip's clock frequency may be decreased. For instance, in one implementation, control circuitry 204 may decrease the voltage supplied to an on-chip oscillator that outputs the chip's clock, wherein such decrease in the voltage supplied to the on-chip oscillator reduces the chip's clock frequency output by the oscillator in the manner disclosed more fully in concurrently filed and commonly assigned U.S. patent application Ser. No. 09/811,255 entitled "SYSTEM AND METHOD UTILIZING ON-CHIP VOLTAGE CONTROLLED FREQUENCY MODULATION TO MANAGE POWER CONSUMPTION," the disclosure of which is hereby incorporated herein by reference.

As described above, this second embodiment utilizes voltage comparator 202 to compare the low-pass filtered voltage ($V_{AVERAGE}$) with the instantaneous on-chip voltage ($V_{INST}$) to determine whether an instantaneous increase in power is being encountered, which needs to be controlled to avoid an undesirable voltage droop. If the instantaneous power consumption of the chip increases above the average voltage (e.g., a step load is encountered), then signal X output by comparator 202 will trigger control circuitry 204 to initiate some appropriate action to reduce the chip's instantaneous power consumption in order to avoid an undesired voltage droop.

It is often desirable to both reduce the long-term (sustained) power consumption of a chip, while also reducing the amount of step loads encountered. Such desires are somewhat in conflict, as generally when long-term power consumption is reduced the amount of step loads encountered tends to increase. That is, generally as long-term (sustained) power consumption is reduced, it becomes more difficult to manage short-term power consumption. Thus, a preferred embodiment of the present invention includes a means for managing both long-term and short-term power consumption of a chip. More specifically, a preferred embodiment provides a means for maintaining the long-term (sustained) power consumption of a chip near a predetermined amount (e.g., a predetermined average for the chip), as well as a means for detecting and responding to step loads encountered on the chip in a manner that minimizes the amount of voltage droop incurred during such step loads.

Figure 3:
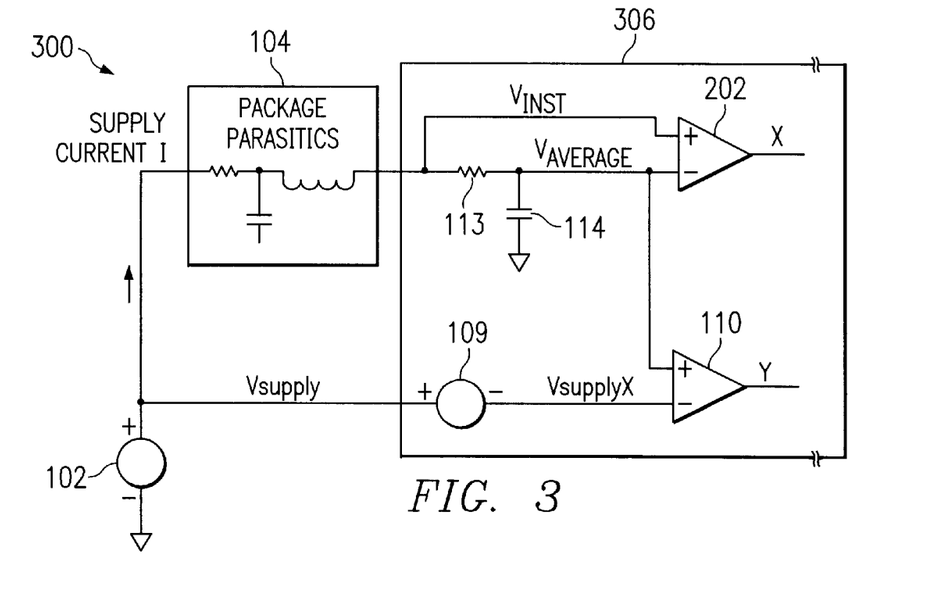
FIG. 3 shows a preferred embodiment of the present invention, which enables management of both long-term (sustained) power consumption and short-term power consumption of a chip.

Turning now to FIG. 3, a canonical implementation of a preferred embodiment of the present invention is shown, wherein like reference numerals are utilized to refer to like components as that of FIGS. 1 and 2. In FIG. 3 a portion of a system 300 is shown, which includes power supply 102 that supplies power to chip 306. As described above with FIGS. 1 and 2, a voltage signal and ground signal are supplied by power supply 102, which are typically fed through some package parasitics 104 to chip 306. Thus, for instance, the resulting voltage signal $V_{INST}$ (or "instantaneous voltage") is received by chip 306. As with chip 106 of FIG. 1 and chip 206 of FIG. 2, it should be understood that chip 306 may be any type of integrated circuit, including without limitation a microprocessor. Chip 306 further includes core chip circuitry (not shown), which may include any functional component(s) of chip 306, and such components of the core chip circuitry receive voltage $V_{INST}$ in the manner described above with FIGS. 1 and 2. Chip 306 further comprises voltage comparators 110 and 202, which are described above in conjunction with FIGS. 1 and 2, respectively.

Thus, with this preferred embodiment, voltage comparator 110 compares the low-pass filtered voltage ($V_{AVERAGE}$) with the voltage supplied by the off-chip power supply 102 (VsupplyX) to determine whether chip 306 is operating below or close to a predetermined sustained power consumption (e.g., a predetermined average power consumption for the chip). As with the above embodiments, it should be understood that $V_{AVERAGE}$ may be RC filtered or filtered by any other suitable low-pass filter. If the sustained power consumption of chip 306 increases above that predetermined amount, then signal Y output by comparator 110 will trigger control circuitry, such as control circuitry 112 of FIG. 1 (not shown in FIG. 3), to initiate some action to reduce the chip's sustained power consumption, as described more fully above with FIG. 1. Additionally, voltage comparator 202 is included to manage short-term power consumption of chip 306. More specifically, voltage comparator 202 compares the low-pass filtered voltage ($V_{AVERAGE}$) with the instantaneous on-chip voltage ($V_{INST}$) to determine whether an instantaneous increase in power is being encountered, which needs to be controlled to avoid an undesirable voltage droop. If the instantaneous power consumption of the chip increases above the average voltage (e.g., a step load is encountered), then signal X output by comparator 202 will trigger control circuitry, such as control circuitry 204 of FIG. 2 (not shown in FIG. 3) to initiate some appropriate action to reduce the chip's instantaneous power consumption in order to avoid an undesired voltage droop.

Figure 4:
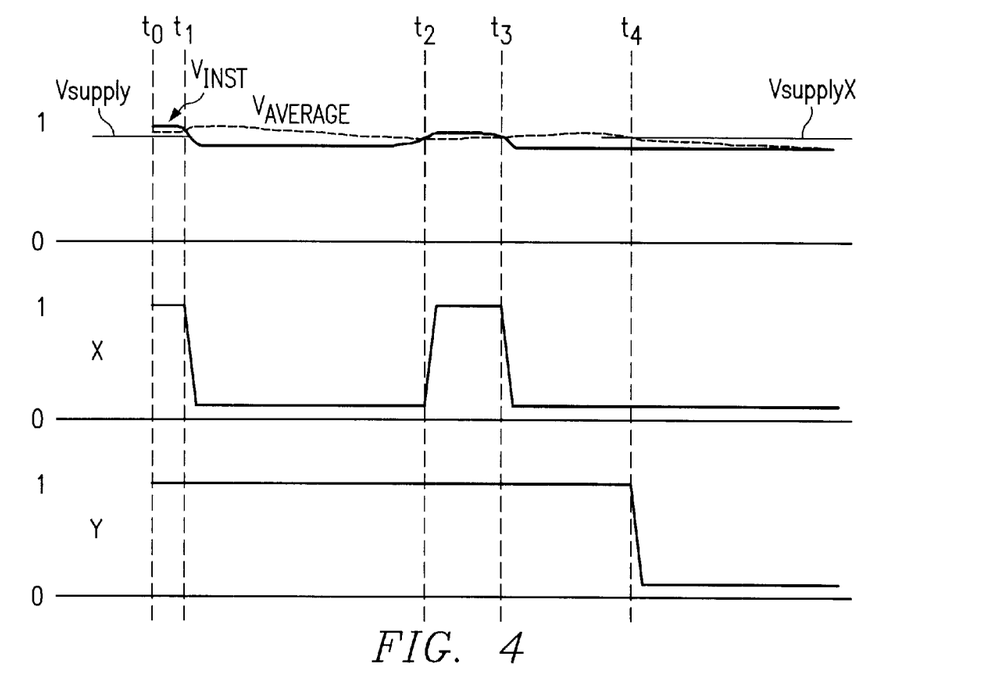
FIG. 4 shows exemplary wave forms to illustrate operation of a preferred embodiment of the present invention.

An example of the operation of such a preferred embodiment is described hereafter in conjunction with the exemplary wave forms of FIG. 4. For the purpose of illustration, signals X and Y are represented in FIG. 4 as a single digital value, although it should be understood that they may consist of multiple binary bits representing the difference in voltage on the input terminals of comparators 202 and 110 respectively. As shown in FIG. 4, at time $t_0$ $V_{INST}$ is greater than $V_{AVERAGE}$, resulting in the output signal "X" of comparator 202 being high, which indicates to the (not shown) that power has recently decreased. This may or may not result in a change in chip behavior to artificially increase power consumption to stabilize the voltage. That is, the control circuitry may or may not trigger appropriate actions to effectively increase power consumption of the chip to stabilize the voltage (e.g., may cause the chip to artificially consume more power by means of current shunts from supply to ground, or by means of initiating artificial activity in functional units on the chip, as examples). Thus, in some embodiments a predetermined floor for the power consumption may be established, and the control circuitry may monitor the output of comparator 202 and ensure that the power consumption does not drop below such floor. Furthermore, at time $t_0$ $V_{AVERAGE}$ is greater than VsupplyX, resulting in the output signal "Y" of comparator 110 being high, which indicates to the control circuitry (not shown) that long term power consumption is below the predetermined average power limit for the chip. At time $t_1$, $V_{INST}$ decreases below $V_{AVERAGE}$, thereby resulting in output signal X of comparator 202 going low, which may indicate an over power condition to its control circuitry, which may in turn trigger appropriate actions to rapidly reduce the power consumption of chip 306 to avoid a large voltage droop. Because $V_{AVERAGE}$ remains greater than VsupplyX at time $t_1$, signal Y remains high, thereby indicating that long-term power consumption is below the predetermined average for the chip.

At time $t_2$, $V_{INST}$ increases above $V_{AVERAGE}$ again, which causes signal X output by comparator 202 to transition high, thereby indicating to the control circuitry that power has decreased and the control circuitry may end the actions that were previously triggered in an attempt to rapidly reduce the power consumption of chip 306. At time $t_3$, $V_{INST}$ decreases below $V_{AVERAGE}$, thereby resulting in output signal X of comparator 202 going low, which may cause its control circuitry to trigger appropriate actions to rapidly reduce the power consumption of chip 306. Because $V_{AVERAGE}$ remains greater than VsupplyX at time $t_3$, signal Y remains high.

At time $t_4$, $V_{AVERAGE}$ decreases below VsupplyX, thereby resulting in output signal Y of comparator 110 going low, which may cause its control circuitry to trigger appropriate actions to reduce the sustained power consumption of chip 306. Therefore, once signal Y transitions low, actions may be triggered not only to reduce the instantaneous power consumption (responsive to signal X being low) but also to reduce the long-term, sustained power consumption.

It should be recognized that a rather sophisticated approach to managing power may be enabled by the embodiments of the present invention. For instance, control circuitry may be implemented in a manner that intelligently triggers particular power-reducing actions to manage long-term and/or short-term power consumption of the chip. For example, suppose the chip has been executing a lot of floating point operations, the control circuitry may decide to throttle integer operations as a power-reducing action, while allowing the floating point operations to continue executing as normal. It should be understood that any level of intelligence may be implemented in initiating power-reducing actions in response to a detected need for long-term and/or short-term power reduction in accordance with any of the embodiments of the present invention.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for managing power consumption of an integrated circuit, said method comprising:

utilizing first on-chip circuitry to determine whether sustained power consumption of said integrated circuit is greater than a first predetermined value;

if determined that said sustained power consumption is greater than said first predetermined value, then triggering an action to reduce said sustained power consumption of said integrated circuit to or below said first predetermined value;

utilizing second on-chip circuitry to determine whether short-term power consumption of said integrated circuit is greater than a second predetermined value; and if determined that said short-term power consumption is greater than said second predetermined value, then triggering an action to reduce said short-term power consumption of said integrated circuit to or below said second predetermined value.

2. The method of claim 1 wherein said step of utilizing said first on-chip circuitry comprises utilizing said first on-chip circuitry for analog detection of said sustained power consumption, and wherein said step of utilizing said second on-chip circuitry comprises utilizing said second on-chip circuitry from analog detection of said short-term power consumption.

3. The method of claim 2 wherein said analog detection of said sustained power and said analog detection of said short-term power consumption comprise detecting an analog electrical characteristic of said integrated circuit.

4. The method of claim 3 wherein said analog electrical characteristic includes voltage.

5. The method of claim 1 further comprising:
if determined that sustained power consumption of said integrated circuit is greater than said first predetermined value, then said first on-chip circuitry outputting a first signal to trigger said action to reduce said sustained power consumption.

6. The method of claim 5 wherein said first signal is received by on-chip control circuitry and said on-chip control circuitry initiates said action to reduce said sustained power consumption.

7. The method of claim 1 wherein said action to reduce said sustained power consumption includes any one or more actions selected from the group consisting of:
reducing the integrated circuit's clock frequency, throttling functional components on said integrated circuit, inserting bubbles into the integrated circuit's operational pipeline, and communicating a signal to a power supply supplying power to said integrated circuit to reduce the voltage delivered by said power supply.

8. The method of claim 1 further comprising:
if determined that said short-term power consumption is greater than said second predetermined value, said second on-chip circuitry outputting a second signal to trigger said action to reduce said short-term power consumption.

9. The method of claim 8 wherein said second signal is received by on-chip control circuitry and said on-chip control circuitry initiates said action to reduce said short-term power consumption.

10. The method of claim 1 wherein said action to reduce said short-term power consumption of said integrated circuit includes decreasing clock frequency of said integrated circuit.

11. The method of claim 1 wherein said action to reduce said short-term power consumption of said integrated circuit includes:
decreasing voltage supplied to an on-chip oscillator that outputs a clock frequency for said integrated circuit, wherein said decreasing voltage causes the clock frequency output by said on-chip oscillator to decrease.

12. The method of claim 1 wherein said utilizing first circuitry to determine whether sustained power consumption of said integrated circuit is greater than said first predetermined value further comprises:
comparing a low-pass filtered voltage of said integrated circuit with clean feed voltage.

13. The method of claim 12 wherein said clean feed voltage comprises voltage supplied to said integrated circuit by an off-chip power supply offset by a predetermined amount.

14. The method of claim 1 wherein said utilizing second circuitry to determine whether short-term power consumption of said integrated circuit is greater than said second predetermined value further comprises:
comparing instantaneous voltage of said integrated circuit with low-pass filtered voltage of said integrated circuit.

15. The method of claim 1 wherein said sustained power consumption includes power consumption for a time period of at least a microsecond, and said short-term power consumption includes power consumption for a time period of less than a microsecond.

16. An integrated circuit comprising:
circuitry operable to perform analog detection of long-term power consumption of said integrated circuit and determine whether said long-term power consumption is greater than a determined value; and
circuitry operable to initiate at least one action for reducing said long-term power consumption if said long-term power consumption is determined to be greater than said determined value.

17. The integrated circuit of claim 16 wherein said determined value is a predetermined value defined for said integrated circuit.

18. The integrated circuit of claim 16 wherein said analog detection comprises:
detecting an analog electrical characteristic of said integrated circuit.

19. The integrated circuit of claim 16 further comprising a low-pass filter.

20. The integrated circuit of claim 19 wherein said circuitry operable to determine whether said long-term power consumption is greater than a determined value comprises:
voltage comparator operable to compare a low-pass filtered voltage of said integrated circuit with clean feed voltage of said integrated circuit, said clean feed voltage comprising voltage supplied to said integrated circuit by an off-chip power supply offset by a predetermined amount.

21. The integrated circuit of claim 16 further comprising:
circuitry operable to perform analog detection of short-term power consumption of said integrated circuit and determine whether said short-term power consumption is greater than a determined value for said short-term power consumption; and
circuitry operable to initiate at least one action for reducing said short-term power consumption if said short-term power consumption is determined to be greater than said determined value for said short-term power consumption.

22. The integrated circuit of claim 21 wherein said integrated circuit further comprises a low-pass filter, said circuitry operable to determine whether said short-term power consumption is greater than a determined value for said short-term power consumption comprises:
voltage comparator operable to compare instantaneous voltage of said integrated circuit with a low-pass filtered voltage of said integrated circuit, said instantaneous voltage comprising the voltage available on the integrated circuit's power grid.

23. A system comprising:

one or more integrated circuits, wherein at least one of said one or more integrated circuits comprises circuitry operable to determine long-term power consumption and short-term power consumption of said at least one integrated circuit based at least in part on analog detection of said long-term power consumption and said short-term power consumption; and circuitry operable to initiate at least one action for reducing at least one of said long-term power consumption and said short-term power consumption of said at least one integrated circuit upon determination that said at least one of said long-term power consumption and said short-term power consumption is above a determined amount.

24. The system of claim 23 wherein said circuitry operable to initiate at least one action being included on said at least one integrated circuit.

25. The system of claim 23 wherein said analog detection comprises detection of an analog electrical characteristic of said integrated circuit, wherein said long-term power consumption and said short-term power consumption are determined based at least in part on said detection of said analog electrical characteristic.

26. The system of claim 23 wherein said long-term power consumption includes power consumption for a time period of at least a microsecond, and wherein said at least one integrated circuit further comprises:

low-pass filter; and voltage comparator operable to compare a low-pass filtered voltage of said at least one integrated circuit with clean feed voltage of said at least one integrated circuit, said clean feed voltage comprising voltage supplied to said at least one integrated circuit by an off-chip power supply offset by a predetermined amount.

27. The system of claim 23 wherein said short-term power consumption includes power consumption for a time period of less than a microsecond, and wherein said at least one integrated circuit further comprises:

low-pass filter; and voltage comparator operable to compare instantaneous voltage of said at least one integrated circuit with a low-pass filtered voltage of said at least one integrated circuit, said instantaneous voltage comprising the voltage available on the at least one integrated circuit's power grid.

28. An integrated circuit comprising:

means for determining power consumption of said integrated circuit based at least in part on analog detection of an electrical characteristic of said integrated circuit, wherein said means for determining power consumption comprises a low-pass filter for determining a low-pass filtered voltage of said integrated circuit;

means for determining whether said power consumption of said integrated circuit is greater than a determined value; and means for initiating reduction in power consumption of said at least one integrated circuit upon determination that said power consumption of said integrated circuit is greater than said determined value.

29. The integrated circuit of claim 28 wherein said electrical characteristic includes voltage and said power consumption includes long-term power consumption including power consumption for a time period of at least a microsecond, said means for determining whether said power consumption of said integrated circuit is greater than a determined value comprises:

voltage comparator operable to compare said low-pass filtered voltage of said integrated circuit with clean feed voltage of said integrated circuit, said clean feed voltage comprising voltage supplied to said integrated circuit by an off-chip power supply offset by a predetermined amount.

30. The integrated circuit of claim 28 wherein said electrical characteristic includes voltage and said power consumption includes short-term power consumption including power consumption for a time period of less than a microsecond, said means for determining whether said power consumption of said integrated circuit is greater than a determined value comprises:

voltage comparator operable to compare instantaneous voltage of said integrated circuit with said low-pass filtered voltage of said integrated circuit, said instantaneous voltage comprising the voltage available on the integrated circuit's power grid.

* * * * *